(12) United States Patent
Kim et al.

(10) Patent No.: US 7,186,919 B2
(45) Date of Patent: Mar. 6, 2007

(54) PRINTED CIRCUIT BOARD INCLUDING EMBEDDED CAPACITORS AND METHOD OF MANUFACTURING THE SAME

(75) Inventors: Jin Cheol Kim, Kyunggi-do (KR); Min Soo Kim, Kyunggi-do (KR); Jun Rok Oh, Seoul (KR); Tae Kyoung Kim, Kyunggi-do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 119 days.

(21) Appl. No.: 11/031,508

(22) Filed: Jan. 6, 2005

(65) Prior Publication Data
US 2006/0032666 A1  Feb. 16, 2006

(30) Foreign Application Priority Data
Aug. 16, 2004 (KR) ............... 10-2004-0064291
Dec. 10, 2004 (KR) ............... 10-2004-0104210

(51) Int. Cl.
*H05K 1/00* (2006.01)
(52) U.S. Cl. ............... 174/250; 174/260; 361/761; 361/763
(58) Field of Classification Search ............... 174/250, 174/260; 361/761–764, 784, 785, 813
See application file for complete search history.

(56) References Cited

U.S. PATENT DOCUMENTS

| | | | |
|---|---|---|---|
| 5,010,641 A | 4/1991 | Sisler | |
| 5,079,069 A | 1/1992 | Howard et al. | |
| 6,663,946 B2 * | 12/2003 | Seri et al. | 428/209 |
| 2004/0150966 A1 * | 8/2004 | Hu | |
| 2004/0231885 A1 * | 11/2004 | Borland et al. | |

* cited by examiner

*Primary Examiner*—Dean A. Reichard
*Assistant Examiner*—Yuriy Semenenko
(74) *Attorney, Agent, or Firm*—Darby & Darby

(57) ABSTRACT

Disclosed herein is a printed circuit board including embedded capacitors, composed of a polymer condenser laminate including a plurality of polymer condenser layers, each of which has a polymer sheet and a conductor pattern formed on the polymer sheet, and a via hole for interlayer connection therethrough, and a circuit layer formed on either surface or both surfaces of the polymer condenser laminate and having a circuit pattern and a via hole for interlayer connection therethrough. The printed circuit board of the current invention has higher capacitance density per unit area than conventional embedded capacitor printed circuit boards, whereby capacitors having various capacitance values, such as multilayered ceramic capacitors having high capacitance, can be embedded in the printed circuit board, instead of being mounted thereon. Also, a method of manufacturing the printed circuit board including embedded capacitors is provided.

4 Claims, 9 Drawing Sheets

+

⋮

PRINTED CIRCUIT BOARD INCLUDING EMBEDDED CAPACITORS AND METHOD OF MANUFACTURING THE SAME

INCORPORATION BY REFERENCE

The present application claims priority under 35 U.S.C. §119 to Korean Patent Application Nos. 2004-64291 filed on Aug. 16, 2004 and 2004-104210 filed Dec. 10, 2004. The content of the applications are incorporated herein by reference in their entireties.

BACKGROUND OF THE INVENTION

1. Field of the Invention

The present invention relates generally to a printed circuit board (PCB) in which a condenser laminate or a capacitor is embedded. More specifically, the present invention relates to a PCB including embedded polymer condenser laminates, which is capable of manifesting higher capacitance density per unit area than conventional PCBs including embedded capacitors, so that capacitors having various capacitance values, for example, multilayered ceramic capacitors (MLCCs) having high capacitance, can be embedded in the PCB, instead of being mounted on the PCB; and a method of manufacturing the same.

2. Description of the Related Art

In general, capacitors store energy in the form of an electric field. When a DC voltage source is applied to a capacitor, the capacitor is charged but the current flow stops. On the other hand, if an AC voltage source is connected to a capacitor, the current flows through the capacitor depending on the frequency of the applied AC signal and the value of the capacitor while the capacitor is charged and discharged.

Thus, the capacitor having the above properties acts as a passive component essential for use in a variety of purposes, for example, coupling and decoupling, filters, impedance matching, charge pumps and demodulation in electric and electronic circuits, such as digital circuits, analog circuits and high frequency circuits. Further, the capacitors, which are manufactured in various forms, such as chips or discs, have been used in the state of being mounted on PCBs.

However, miniaturization and complication of the electronic devices lead to reducing the areas for mounting the passive components on the PCB. Also, while frequencies become higher in accordance with high speed electronic devices, parasitic impedance is generated by the conductor, solder, etc., between the passive component and the IC, thus causing several problems. To solve the problems, various attempts have been made to embed the capacitor in the PCB, mainly led by the manufacturers of PCBs and electric and electronic components.

Although discrete chip resistors or discrete chip capacitors have long since been mounted on PCBs, PCBs including embedded passive components such as resistors or capacitors have only been recently developed.

In techniques of manufacturing PCBs including embedded passive components, passive components such as resistors or capacitors are provided in PCBs using novel materials and processes, to substitute for conventional chip resistors and chip capacitors. That is, the PCB including embedded passive components means that the passive component, for example, capacitor, is embedded in the inner layer of the PCB. Regardless of the size of the PCB itself, if the capacitor as the passive component is incorporated in the PCB, this is called an 'embedded capacitor'. Such a substrate is referred to as an embedded capacitor PCB. The major characteristic of the embedded capacitor PCB is that the capacitor is intrinsically provided in the PCB without the need to mount the capacitor on the PCB.

FIGS. 1a to 1e show a conventional process of manufacturing a PCB including embedded polymer film type capacitors, in which a polymer capacitor paste is applied on a substrate and then hot dried (or cured), to realize the PCB including the embedded polymer film type capacitor.

In a first step, a copper foil layer of an inner layer 41 of the PCB comprising a FR-4 reinforced base sheet 42 is coated with a dry film, followed by being exposed and developed. Then, the copper foil layer is etched to form anodic copper foils 44a and 44b, cathodic copper foils 43a and 43b, and spaces therebetween (FIG. 1a).

In a second step, capacitor pastes 45a and 45b composed of a polymer that contains ceramic powder having a high dielectric constant are applied on the cathodic copper foils 43a and 43b by a screen printing process, and then dried or cured (FIG. 1b). Herein, the screen printing is performed by applying a media such as ink on a stencil screen using a squeeze, thereby transferring a pattern to a substrate.

At this step, the spaces between the anodic copper foils 44a and 44b and the cathodic copper foils 43a and 43b are covered with the capacitor pastes 45a and 45b.

In a third step, a conductive paste including silver or copper is formed into anodes 46a and 46b using a screen printing process, and dried or cured (FIG. 1c).

In a fourth step, the capacitor layer subjected to first to third steps of the inner layer 41 of the PCB is inserted between insulating layers 47a and 47b, followed by being laminated (FIG. 1d).

In a fifth step, a through hole and laser blind via holes 49a and 49b are formed through the laminate, whereby the capacitor present in the inner layer of the PCB is connected to positive terminals 51a and 51b and negative terminals 50a and 50b of IC chips 52a and 52b mounted outside the PCB, thus acting as an embedded capacitor (FIG. 1e).

Likewise, there are disclosed methods of manufacturing the embedded discrete type capacitor by coating the PCB with a ceramic filled photosensitive resin, which have been patented by Motorola Co. Ltd., USA. The above method comprises applying the photosensitive resin containing ceramic powder on the substrate, laminating copper foil on the resin layer to form upper electrodes and lower electrodes, forming a circuit pattern, and then etching the photosensitive resin, to realize the discrete capacitor.

Further, there are proposed methods of fabricating the embedded capacitor by separately including a dielectric layer having capacitance properties in the inner layer of the PCB, so as to be used instead of a decoupling capacitor mounted on the PCB, which have been patented by Sanmina Co. Ltd., USA. In this method, the dielectric layer comprising power electrodes and ground electrodes is incorporated in the inner layer of the PCB, to obtain a power distributed decoupling capacitor.

Various processes are under study to achieve the above techniques, in which methods of embodying each process vary.

In this regard, U.S. Pat. No. 5,079,069 granted to Howard et al. discloses a capacitor laminate for use in capacitive printed circuit boards and methods of manufacture, in which the concept of 'borrowed capacitor' is used, to manufacture the PCB comprising the laminated capacitor as a structurally rigid assembly formed of sheets of conductive material and an intermediate sheet of dielectric material, which is in operative connection with a large number of devices.

Also, U.S. Pat. No. 5,010,641 granted to Sisler et al. discloses a method of making a multilayer printed circuit board to eliminate the need for the by-pass capacitor by providing one or more fully cured power-ground plane sandwich components which are laminated together with other partially cured component layers of the board and circuit pattern-formed components.

In the embedded capacitor PCBs according to the conventional techniques, the chip type capacitor is embedded in the portion of the PCB, or the singular sheet type dielectric layer is inserted between the layers constituting the PCB.

However, the embedded capacitor PCBs manufactured by the above techniques have capacitance density of 0.5 to 3 nF per inch, which is an insufficient value to completely embed the capacitor in the PCB. Moreover, limitations are imposed on reduction of the mounting area of the passive component.

Therefore, there are required novel techniques of embedding high density capacitors, such as MLCCs, which are mounted on the PCB but not embedded therein at present, in the PCBs, by realizing higher capacitance density per unit area than conventional embedded capacitor PCBs.

SUMMARY OF THE INVENTION

Accordingly, the present invention has been made keeping in mind the above problems occurring in the related art, and an object of the present invention is to provide a PCB including embedded capacitors in which a dielectric laminate is incorporated, and a method of manufacturing the same.

Another object of the present invention is to provide a PCB including embedded capacitors which exhibits higher capacitance density than conventional embedded capacitor PCBs, and a method of manufacturing the same.

Still another object of the present invention is to provide a PCB including embedded capacitors in which an area for mounting passive components is drastically reduced, and a method of manufacturing the same.

A further object of the present invention is to provide a PCB including embedded capacitors in which the capacitor can be desirably designed so that various capacitance values can be realized in a PCB having limited thickness, and a method of manufacturing the same.

In order to accomplish the above objects, according to a first aspect of the present invention, a method of manufacturing a PCB including embedded capacitors is provided, the method comprising forming a polymer condenser laminate including a plurality of polymer condenser layers, each of which has a polymer sheet having a high dielectric constant and a conductor pattern formed on the polymer sheet; forming a via hole for interlayer connection through a double sided CCL and a circuit pattern on the double sided CCL, to prepare a patterned CCL; layering the patterned CCL on either surface of the polymer condenser laminate; and forming a via hole through the polymer condenser laminate and a circuit pattern on the polymer condenser laminate.

According to a second aspect of the present invention, a method of manufacturing a PCB including embedded capacitors is provided, the method comprising forming a polymer condenser laminate including a plurality of polymer condenser layers, each of which has a polymer sheet having a high dielectric constant and a conductor pattern formed on the polymer sheet; forming a via hole through the polymer condenser laminate; filling the via hole by plating and forming a circuit pattern; forming a via hole through a double sided CCL and a circuit pattern on the double sided CCL, to prepare a patterned CCL; layering an insulating layer on either surface or both surfaces of the polymer condenser laminate; layering the patterned CCL on the insulating layer; forming a via hole for interlayer electrical connection through the PCB; and filling the via hole by plating and forming a circuit pattern on the PCB.

Further, a PCB including embedded capacitors is provided, comprising a polymer condenser laminate including a plurality of polymer condenser layers, each of which has a polymer sheet and a conductor pattern formed on the polymer sheet, and a via hole for interlayer connection therethrough; and a circuit pattern layer formed on either surface or both surfaces of the polymer condenser laminate, and having a circuit pattern and a via hole for interlayer connection therethrough.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a detailed description will be given of the present invention, with reference to the appended drawings.

FIGS. 2, 3a, 3b, 4, and 5a to 5d show a process of manufacturing a PCB including embedded capacitors, according to an embodiment of the present invention.

Figure 1A:
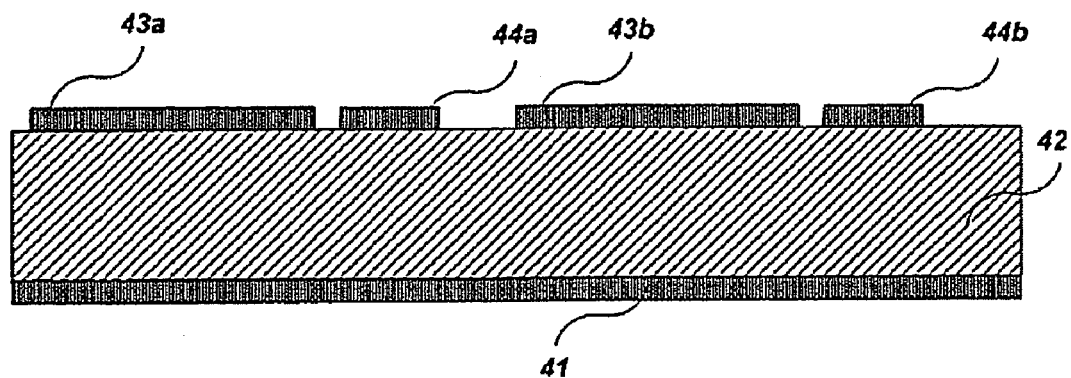
FIGS. 1a to 1e are views showing a conventional process of manufacturing a PCB including embedded polymer film type capacitors.
Figure 1B:
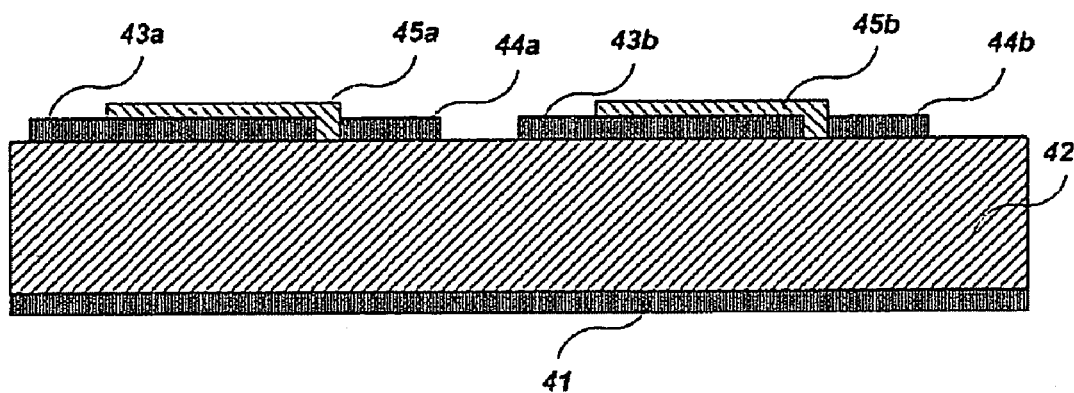
Figure 1C:
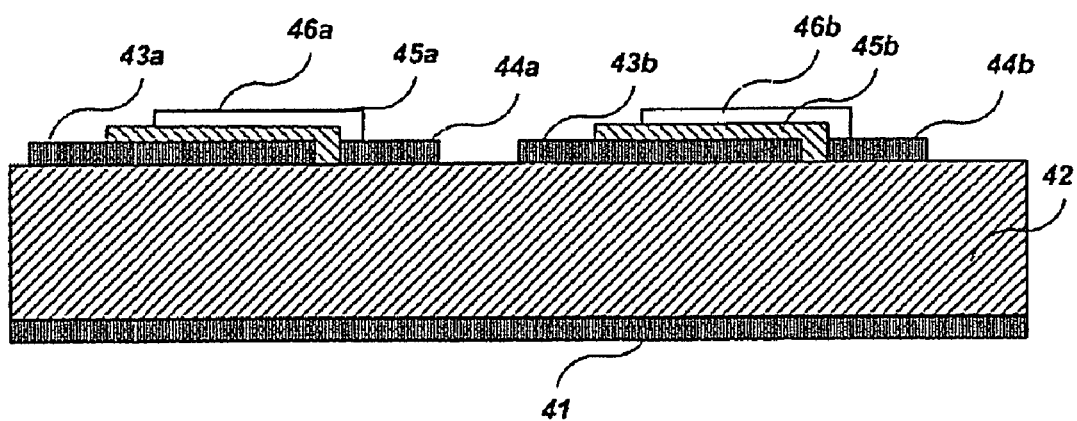
Figure 1D:
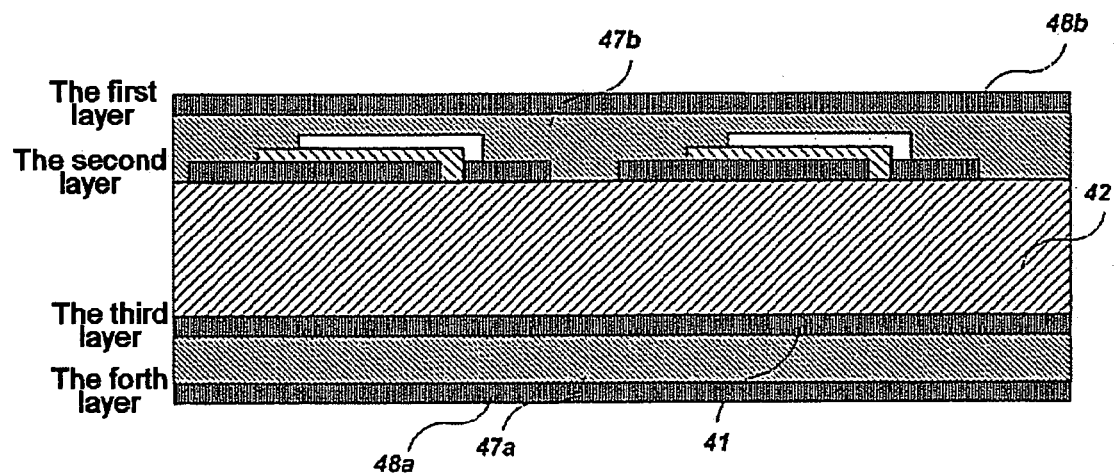
Figure 1E:
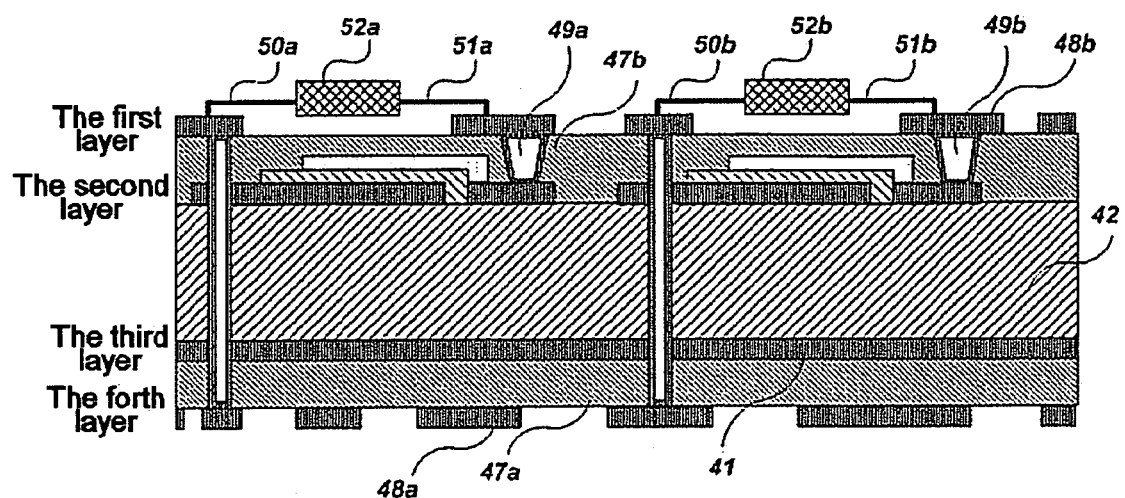
Figure 2:
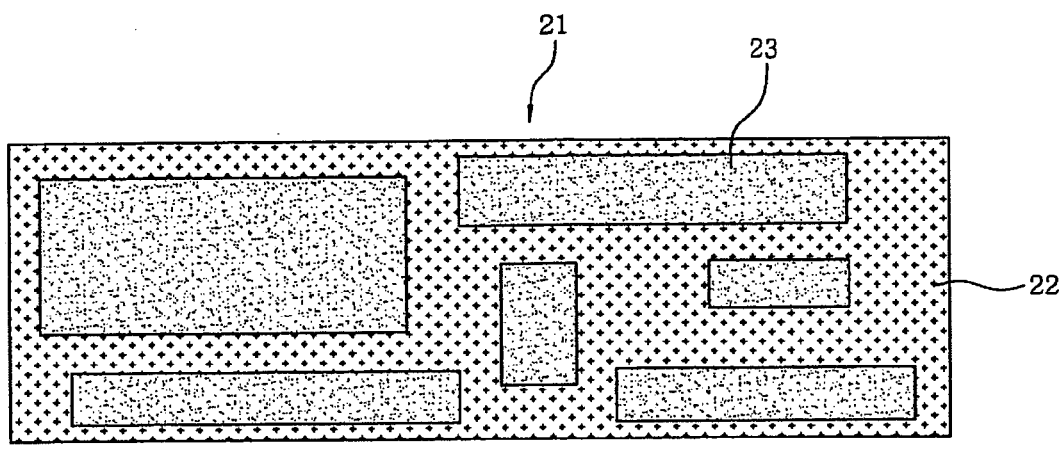
FIGS. 2, 3a, 3b, 4, and 5a to 5d are views showing a process of manufacturing a PCB including embedded capacitors, according to an embodiment of the present invention.

As shown in FIG. 2, a conductor 23, such as aluminum or copper, is patterned into a predetermined pattern on a wide flat polymer sheet 22 having a high dielectric constant, to form a polymer condenser layer 21.

The patterning method of the conductor 23 includes, for example, a dry process such as sputtering, and a wet process such as screen printing.

Figure 3A:
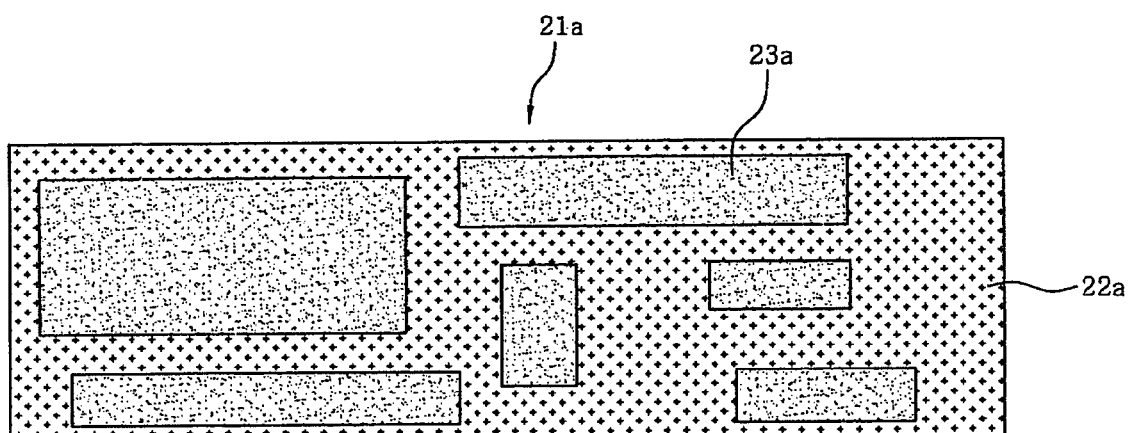
Figure 3A:
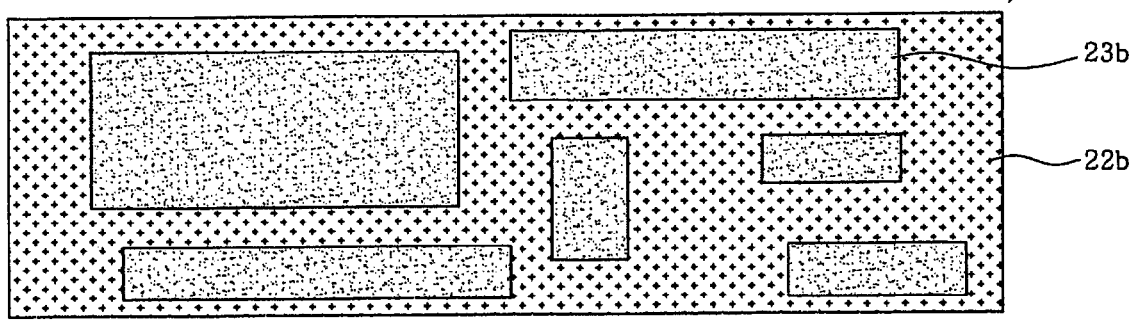

In FIG. 3a, a first polymer condenser layer 21a having a first conductor pattern 23a and a second polymer condenser layer 21b having a second conductor pattern 23b are aligned and then laminated together. As is apparent from FIG. 3a, the first and second conductor patterns 23a and 23b of the first and second condenser layers 21a and 21b, respectively, are positioned to be relatively shifted with respect to each other, therefore resulting in a laminated capacitor form. Although the conductor patterns 23a and 23b shown in FIG. 3a are shifted to the left and right, they may be shifted up or down or in predetermined directions.

Alternatively, the first conductor pattern 23a, the second polymer sheet 22b, and the second conductor pattern 23b, in order, may be layered on the first polymer sheet 22a.

Further, although the layering process using the two polymer condenser layers 21a and 21b is illustrated in FIG. 3a, the number of polymer condenser layers to be laminated may be appropriately controlled depending on required capacitance.

More specifically, capacitance varies with the area and thickness of the capacitor, and is calculated by Equation 1, below:

$$C = \varepsilon_r \varepsilon_0 \left( \frac{A}{D} \right) \quad \text{Equation 1}$$

Wherein, $\varepsilon_r$ is a dielectric constant of a dielectric material, and $\varepsilon_0$ is a constant having a value of $8.855 \times 10^{-8}$, and A is a surface area of a dielectric material, and D is a thickness of a dielectric material. That is, to realize the capacitor having high capacitance, the dielectric material should have a high dielectric constant. Also, as the thickness of the dielectric material is reduced and the surface area thereof is increased, the capacitor having higher capacitance can be obtained. If the number of polymer condenser layers to be laminated increases, the surface area of the dielectric material increases, and thus, the capacitance increases. Meanwhile, if the number of polymer condenser layers to be laminated decreases, a capacitor having low capacitance is obtained. Thus, in the present invention, the number of polymer condenser layers is adjusted to determine the capacitance of the capacitor embedded in the PCB.

Figure 3B:
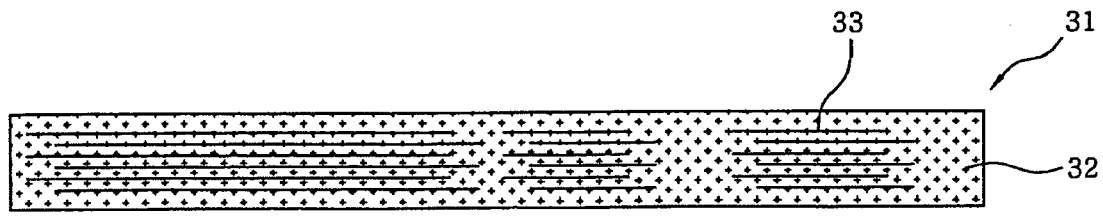

FIG. 3b shows a cross-section of a polymer condenser laminate 31 having a plurality of flat polymer condenser layers. The polymer condenser laminate 31 resulting from lamination of the plurality of polymer condenser layers has a structure of the conductors 33 having a predetermined pattern inserted between the polymer sheets 32 having a high dielectric constant.

Figure 4:

In FIG. 4, via holes 44 are formed at predetermined positions on a Copper Clad Laminate (CCL) substrate comprising an FR-4 reinforced base sheet 42 and copper foil layers on both surfaces thereof, by a laser drilling process or a mechanical drilling process, and then filled by a plating process. Then, dry film is applied on both surfaces of the CCL substrate, followed by being exposed and developed. Subsequently, the copper foil layer is etched to form a circuit pattern 43, thereby preparing a patterned CCL 41.

The circuit pattern 43 may be formed by any one process selected from among an etching process, a plating process and combinations thereof. Further, in addition to the FR-4 reinforced base sheet as the CCL substrate, any CCL substrate may be used so long as it includes a material appropriate for end uses of the PCB.

Figure 5A:
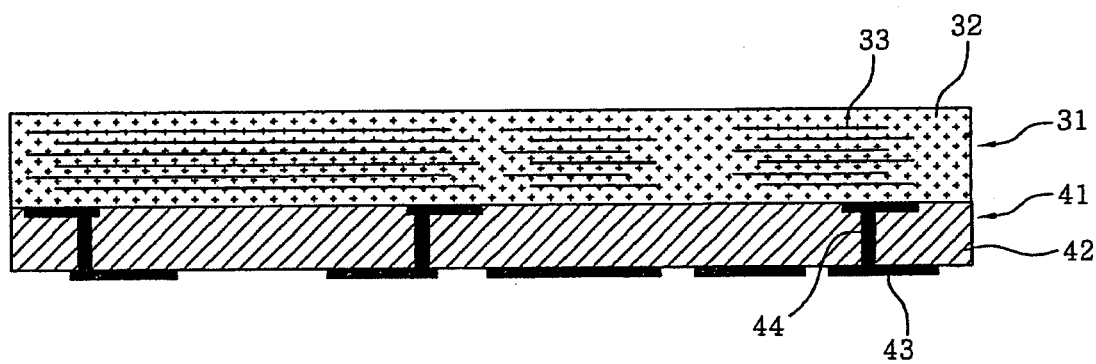

In FIG. 5a, the polymer condenser laminate 31 of FIG. 3b is layered on the patterned CCL 41.

Figure 5B:
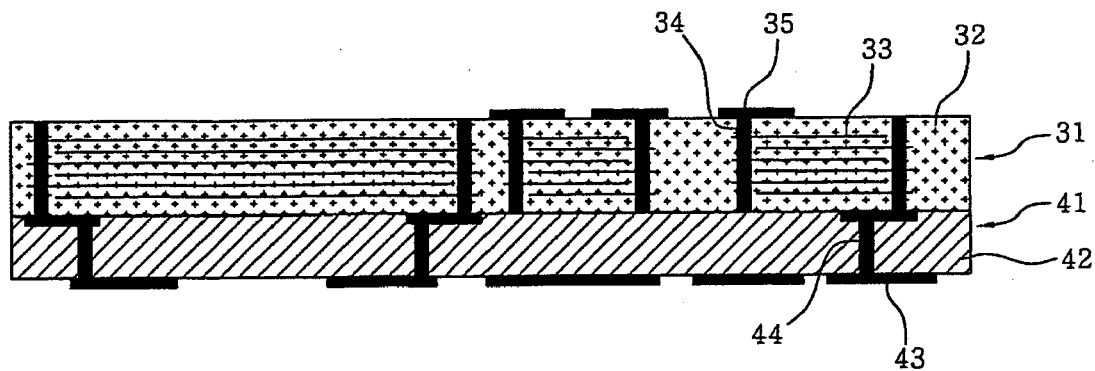

In FIG. 5b, via holes 34 for interlayer connection are formed through the polymer condenser laminate 31, and are filled by a plating process or filler. Then, on the polymer condenser laminate 31, a copper foil layer is formed by a plating process, and then coated with a dry film, followed by being exposed and developed. Subsequently, the copper foil layer is etched to form a circuit pattern 35. The circuit pattern 35 may be formed by any one process selected from among an etching process, a plating process and combinations thereof.

Figure 5C:
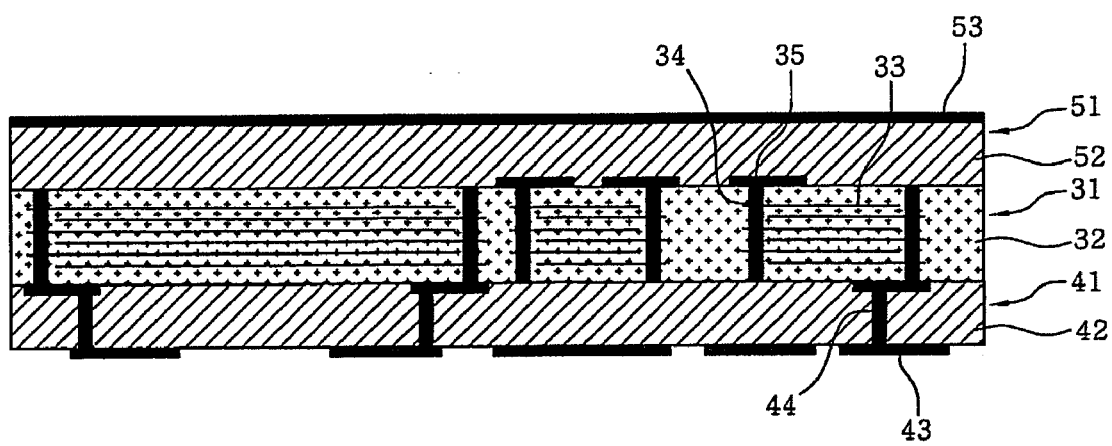

In FIG. 5c, on the polymer condenser laminate 31, a single sided CCL substrate 51 including an insulating layer 52 and a copper foil layer 53, for example, RCC (Resin Coated Copper), is layered.

Figure 5D:
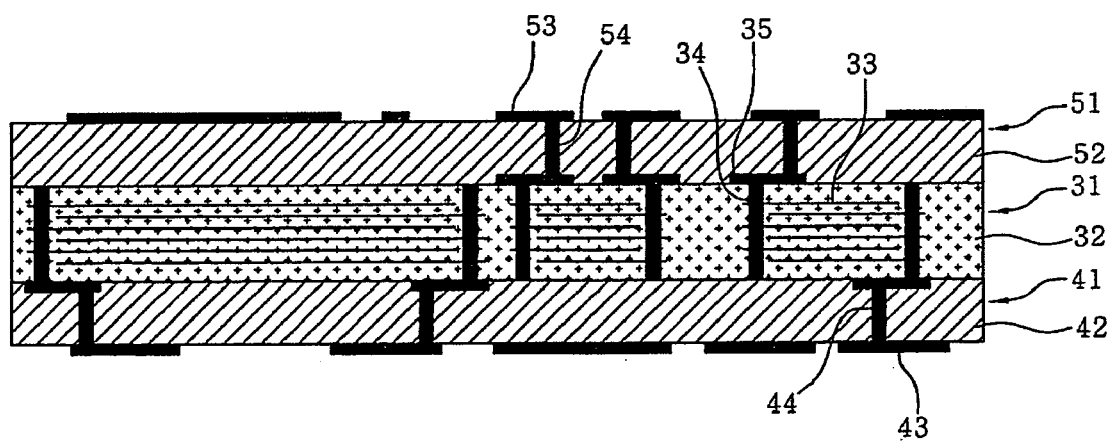

In FIG. 5d, via holes 54 are formed through the CCL substrate 51, after which the copper foil layer of the CCL substrate 51 is coated with a dry film, followed by being exposed and developed. Then, the copper foil layer is etched, to form a desired circuit pattern 53.

As shown in FIG. 5d, the PCB including embedded condensers according to the above embodiment of the present invention has therein the polymer condenser laminate 31 composed of a dielectric material having a high dielectric constant.

FIGS. 6a to 6f show a process of manufacturing a PCB including embedded capacitors, according to another embodiment of the present invention.

Figure 6A:
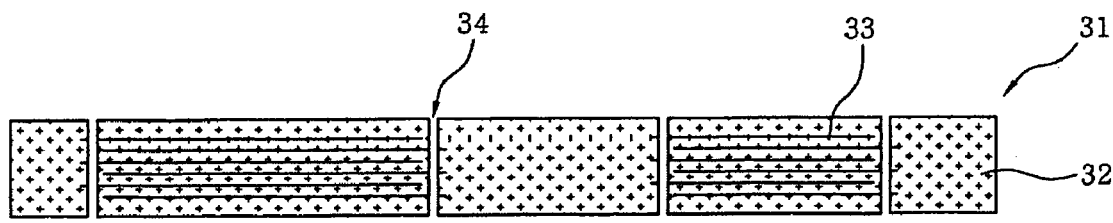
FIGS. 6a to 6g are views showing a process of manufacturing a PCB including embedded capacitors, according to another embodiment of the present invention.

In FIG. 6a, via holes 34 are drilled at predetermined positions on the polymer condenser laminate 31 obtained by the process shown FIGS. 2, 3a and 3b. As such, it is preferable that a laser drilling process be performed.

Figure 6B:
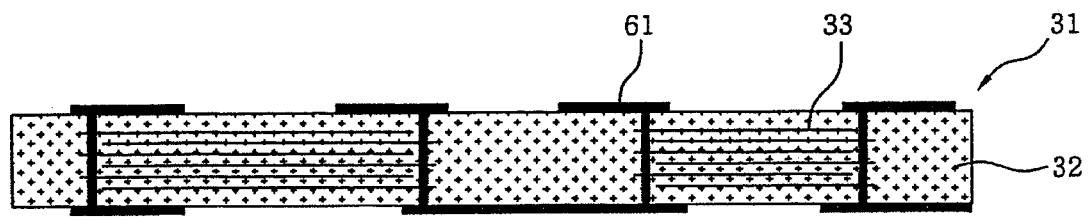

In FIG. 6b, a photosensitive film is laminated on both surfaces of the polymer condenser laminate 31, after which a mask having a predetermined pattern is placed on the photosensitive film, followed by being exposed, to form a film pattern. Then, the film pattern is subjected to electroless plating and electroplating, to obtain a circuit pattern 61. At the same time as the circuit pattern 61 is formed, the via holes 34 are filled by plating.

Figure 6C:
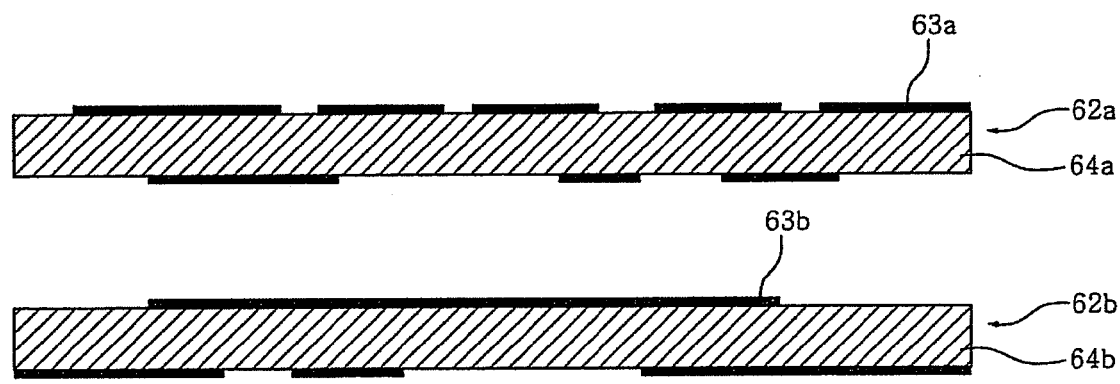

While the polymer condenser laminate 31 is formed as mentioned above, patterned CCLs 62a and 62b having circuit patterns 63a and 63b, respectively, are prepared as in FIG. 6c. The patterned CCLs 62a and 62b can be obtained by forming a resist pattern for etching on both surfaces of CCLs, followed by being etched, or forming a resist pattern for plating thereon, followed by being plated, in which the CCLs include insulating layers 64a and 64b and copper foil layers formed on both surfaces thereof, respectively.

Figure 6D:
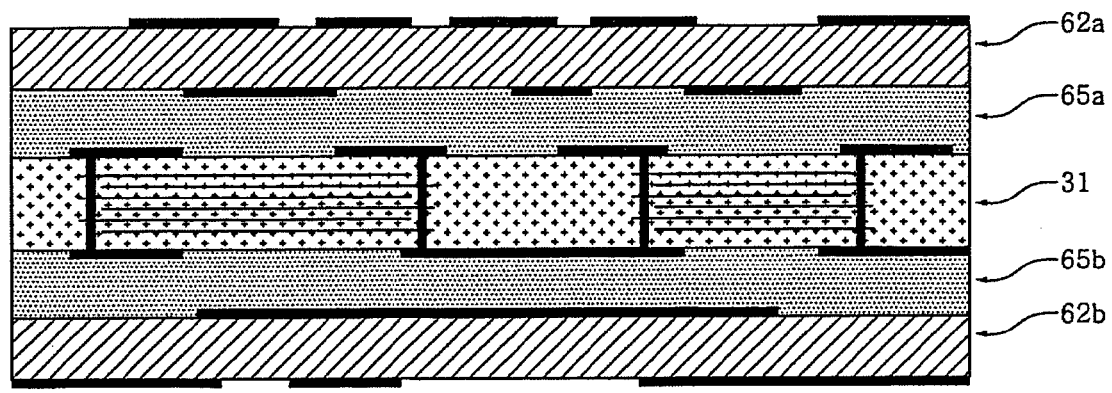

In FIG. 6d, insulating layers for interlayer insulation, for example, prepregs 65a and 65b, are placed on both surfaces of the polymer condenser laminate 31 having via holes 34 as in FIG. 6b, after which the patterned CCLs 62a and 62b are laid on the insulating layers 65a and 65b, followed by being compressed together.

Figure 6E:
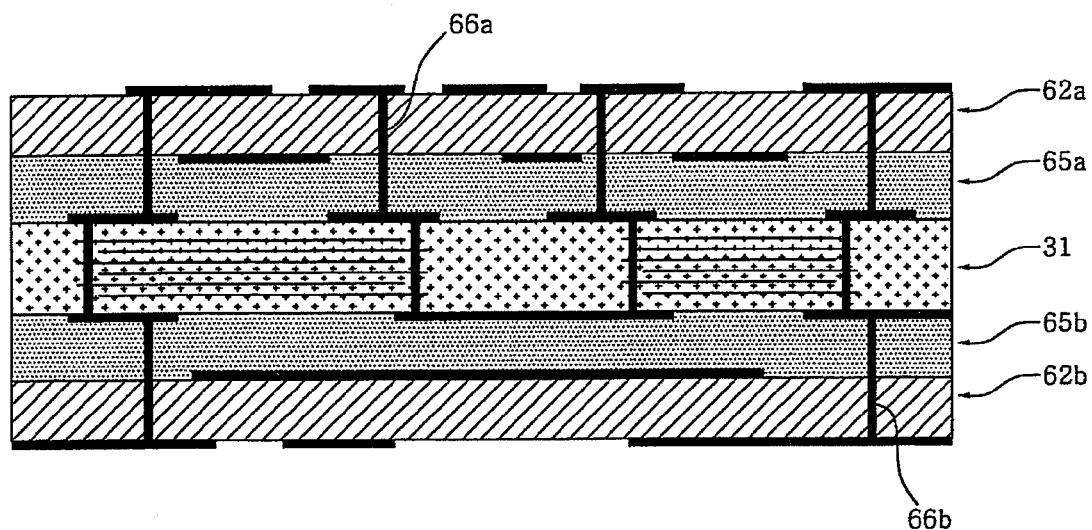

In FIG. 6e, through holes 66a and 66b are formed to electrically connect the circuit patterns 63a and 63b of the patterned CCLs 62a and 62b and the circuit patterns 61 formed on the polymer condenser laminate 31. Then, the through holes 66a and 66b are filled with a conductive material by a plating process.

Figure 6F:
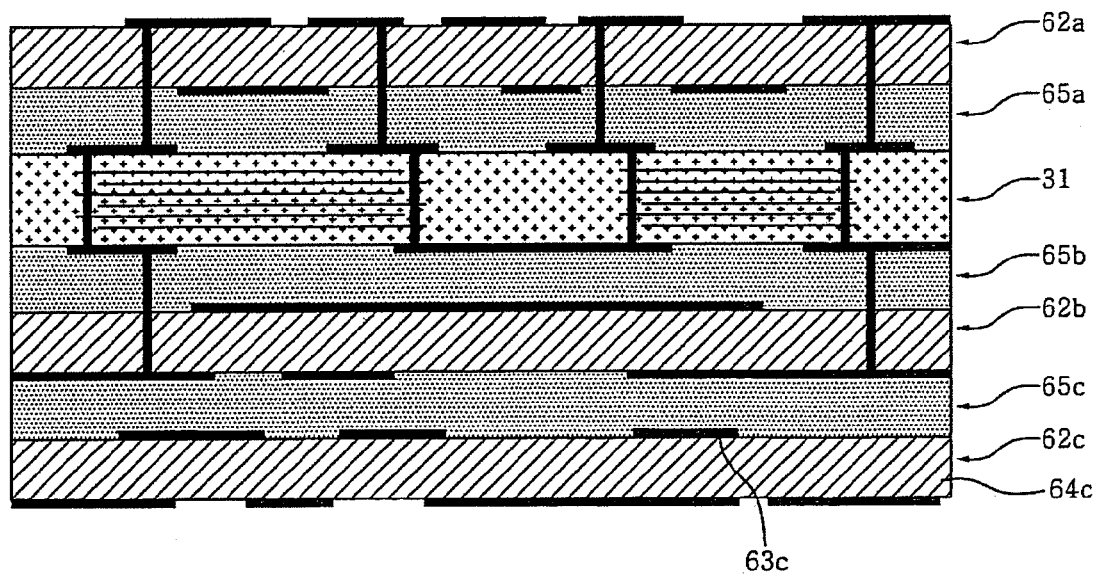

In FIG. 6f, to layer a further circuit pattern layer, an insulating layer for interlayer insulation, for example, a prepreg, 65c, and a patterned CCL 62c are sequentially superimposed on a lower surface of the substrate shown in FIG. 6e, followed by being compressed. The patterned CCL 62c includes an insulating layer 64c and circuit patterns 63c formed on both surfaces thereof.

Figure 6G:
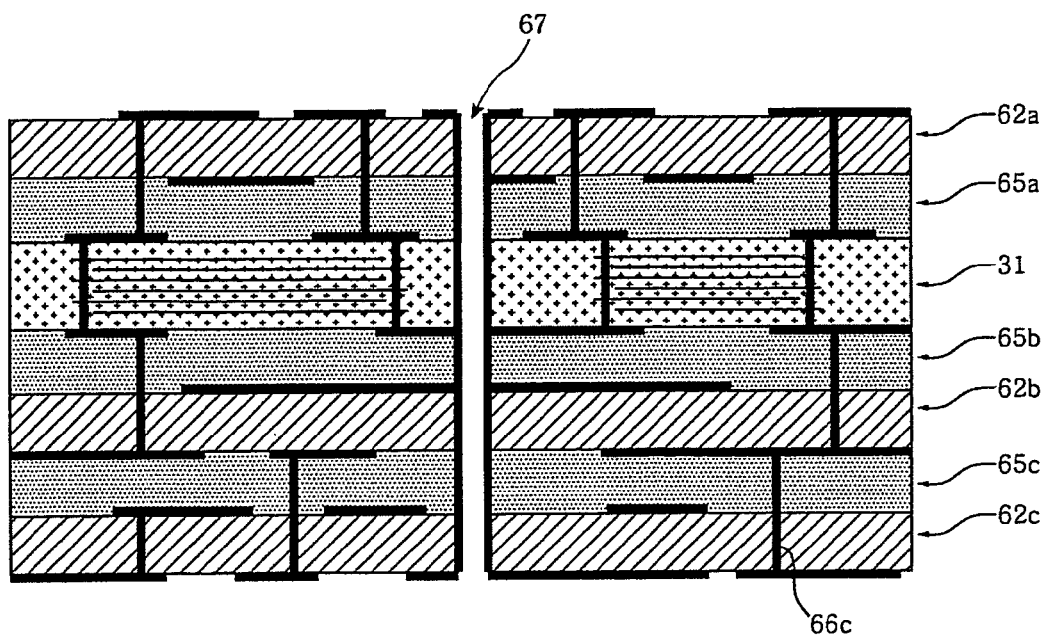

In FIG. 6g, through holes 66c are laser-drilled to electrically connect the circuit patterns 63c on the additionally layered CCL 62c to the circuit patterns of the other layers. Also, a through hole 67 which passes completely through the substrate is laser-drilled. The through holes 66c and 67 are filled with a conductive filler by a plating process.

As shown in FIG. 6g, the PCB including embedded condensers according to the second embodiment of the present invention has the polymer condenser laminate 31 composed of a dielectric material having a high dielectric constant therein.

Although the process of forming the circuit pattern layers on both surfaces of the polymer condenser laminate 31 is illustrated in FIGS. 6a to 6g, a further circuit pattern layer may be formed on only one surface of the polymer condenser laminate 31, or as many prepregs and circuit pattern layers as necessary may be additionally formed by repeating the above process.

FIGS. 7a to 7d show a process of manufacturing a PCB including embedded capacitors, according to a further embodiment of the present invention.

Figure 7A:
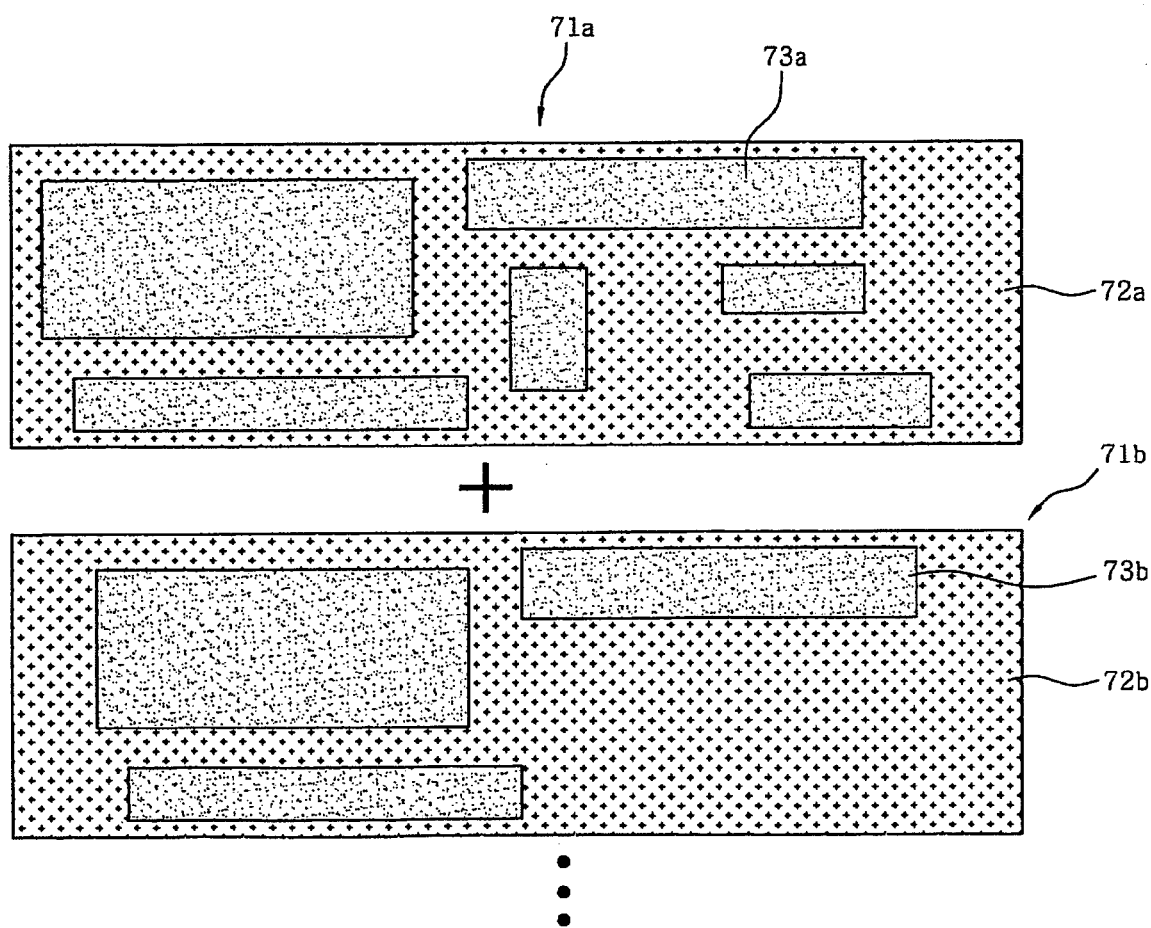
FIGS. 7a to 7d are views showing a process of manufacturing a PCB including embedded capacitors, according to a further embodiment of the present invention.

As in the above embodiments, in FIG. 7a, conductor patterns 73a and 73b made of aluminum or copper and having predetermined patterns are formed on wide flat polymer sheets 72a and 72b having high dielectric constants, respectively, to prepare first and second polymer condenser layers 71a and 71b.

The conductor pattern may be formed by a dry process such as sputtering, or a wet process such as screen printing.

The first and second polymer condenser layers 71a and 71b having first and second conductor patterns 73a and 73b, respectively, are aligned and then laminated together. Alternatively, after the first conductor pattern 73a is formed on the first polymer sheet 72a, the second polymer sheet 72b is layered on the first conductor pattern 73a, and then, the conductor pattern shifted with respect to the first conductor pattern 73a of the first polymer condenser layer 71a may be formed on the second polymer sheet 72b. In this way, a desired polymer condenser laminate is obtained.

As is apparent from FIG. 7a, it can be shown that the predetermined portion of the first conductor pattern 73a of the first polymer condenser layer 71a is omitted in the second conductor pattern 73b of the second polymer condenser layer 71b when the first polymer condenser layer 71a is compared with the second polymer condenser layer 71b.

Figure 7B:
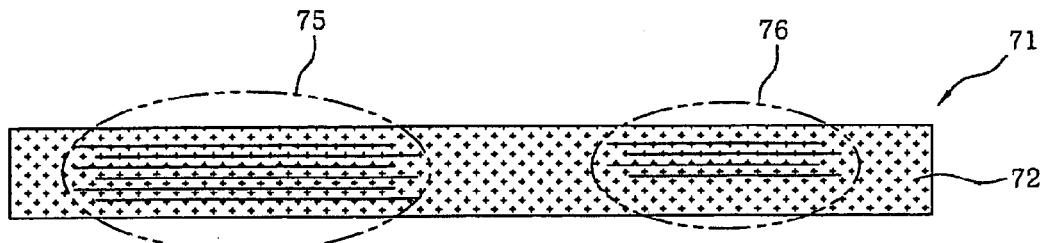

The first and second polymer condenser layers 71a and 71b shown in FIG. 7a are relatively shifted with respect to each other and multilayered, thereby obtaining a polymer condenser laminate 71 having a cross-section shown in FIG. 7b. That is, a portion 75 of the polymer condenser laminate 71 shows the conductor pattern uniformly distributed in a thickness direction of the polymer condenser laminate 71, while the other portion 76 of the polymer condenser laminate 71 shows the conductor pattern partially distributed in a thickness direction of the polymer condenser sheet 71.

Figure 7C:
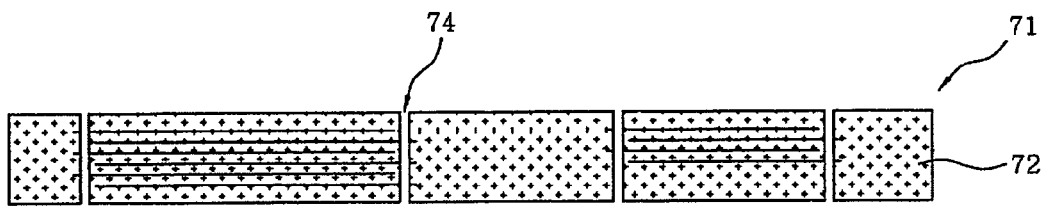
Figure 7D:
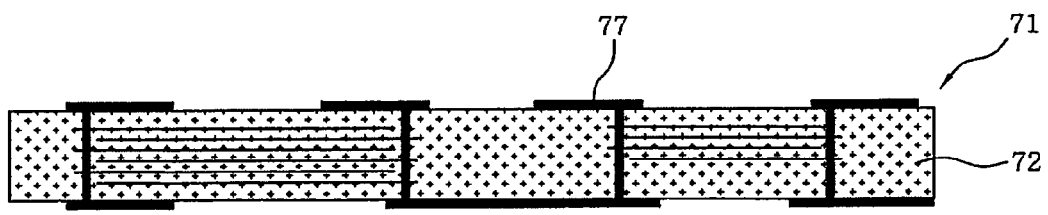

Subsequently, via holes 74 are drilled as shown in FIG. 7c. In FIG. 7d, the via holes 74 are filled by a plating process, and, simultaneously, a circuit pattern 77 is formed. Then, CCLs having circuit patterns and insulating layers are sequentially layered on both surfaces of the polymer condenser laminate 71 shown in FIG. 7d, and the PCB including embedded capacitors thereby manufactured.

In this way, capacitors are diversely designed so that various capacitance values can be realized in the polymer condenser laminate 71 having a limited thickness.

Specifically, capacitance of the capacitor increases in proportion to the area of electrodes of the capacitor, according to Equation 1. In the polymer condenser laminate according to the present invention, a flat type capacitor is provided in a folded shape. Thus, if the number of polymer condenser layers increases, the same effect as enlarging the area of electrodes of the flat type capacitor can be manifested, thereby increasing the capacitance value.

In FIG. 7b, the portion 75 requiring high capacitance includes the larger number of polymer condenser layers having conductor patterns, to which electrodes are connected, to realize the capacitor having high capacitance. On the other hand, the other portion 76 requiring low capacitance has fewer layers having conductor patterns, to obtain the capacitor having low capacitance.

By adjusting the area of the conductor pattern of the polymer condenser laminate, the capacitor portion requiring high capacitance is designed to increase the area of the conductor pattern, while the capacitor portion requiring low capacitance is designed to decrease the area of the conductor pattern. Thereby, the capacitors having desired values can be variously designed in the polymer condenser laminate having limited thickness and area.

Figure 8A:
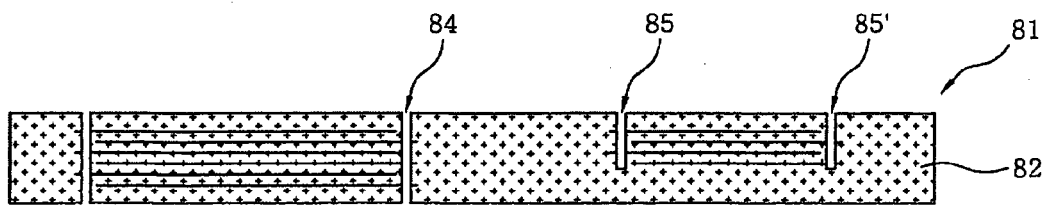
FIGS. 8a and 8b are views showing a process of manufacturing a PCB including embedded capacitors, according to another embodiment of the present invention.
Figure 8B:
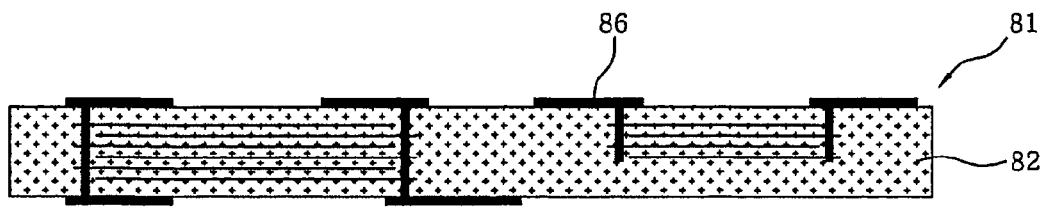

FIGS. 8a and 8b show cross-sections of a polymer condenser laminate according to another embodiment of the present invention.

After the polymer condenser layers formed as in FIG. 7a are multilayered, a through hole 84 is formed through a portion having a conductor pattern distributed uniformly in a thickness direction of the substrate, and blind via holes 85 and 85' are formed through a portion having a conductor pattern distributed in part to realize a capacitor having low capacitance, as shown in FIG. 8a. The through hole 84 is formed by a laser drilling process, while the blind via holes 85 and 85' are formed by appropriately controlling the intensity of the laser according to the desired depth.

In FIG. 8b, the holes 84, 85 and 85' are filled by a plating process, and a circuit pattern 86 is formed on the polymer condenser laminate 81.

Then, as in the above embodiments, CCLs having circuit patterns and insulating layers are sequentially layered on both surfaces of the polymer condenser laminate 81 shown in FIG. 8b, thereby obtaining a PCB including embedded capacitors.

As described above, the present invention provides a PCB including embedded capacitors, and a method of manufacturing the same. According to the PCB and the manufacturing method thereof of the present invention, the PCB of the present invention has higher capacitance density (100 nF/mm$_2$ or more), compared to conventional PCBs including embedded capacitors. Thus, the capacitors having high capacitance, which have previously been mounted on the electronic circuit board, can be formed therein.

According to the PCB and the manufacturing method thereof of the present invention, the mounting area of the passive components on the PCB can be drastically decreased, and also, capacitance of the capacitor can be controlled by the number of polymer layers, as well as areas of the polymer layer and the electrode layer, compared to conventional methods. Thus, reliable capacitors can be variously designed.

According to the PCB and the manufacturing method thereof of the present invention, the capacitors having various capacitance values can be embedded in the PCB having limited thickness.

According to the PCB and the manufacturing method thereof of the present invention, the generation of parasitic inductance between capacitors and chips as in conventional embedded capacitor PCBs can be reduced, thereby minimizing errors and deterioration of signals in high speed ICs.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A printed circuit board including embedded capacitors, comprising:
    a polymer condenser laminate, the laminate including a plurality of polymer condenser layers, the plurality of polymer condenser layers being laminated to form an embedded capacitor within the polymer condenser laminate, each polymer condenser layer including a polymer sheet and a conductor pattern formed on the polymer sheet, and the polymer condenser laminate further including a via hole for interlayer connection therethrough; and
    a circuit layer formed on at least one surface of the polymer condenser laminate, and having a circuit pattern and a via hole for interlayer connection therethrough.

2. The printed circuit board as set forth in claim 1, wherein the polymer condenser laminate further comprises a via hole for connection to an external power line or ground line therethrough.

3. The printed circuit board as set forth in claim 1, wherein the conductor patterns of the plurality of polymer condenser layers are relatively shifted with respect to each other.

4. The printed circuit board as set forth in claim 1, wherein the conductor patterns of the plurality of polymer condenser layers are different with respect to each other.

* * * * *